United States Patent
Narayan (10) Patent No.: US 7,170,914 B2
(45) Date of Patent: Jan. 30, 2007

(54) OPTICAL TRANSMITTERS

(75) Inventor: Raghuram Narayan, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 10/608,327

(22) Filed: Jun. 27, 2003

(65) Prior Publication Data

US 2004/0264539 A1   Dec. 30, 2004

(51) Int. Cl.
    H01S 3/04    (2006.01)
(52) U.S. Cl. .......................... 372/34; 372/36
(58) Field of Classification Search ............... 372/34, 372/36, 29.02, 29.01
    See application file for complete search history.

(56) References Cited

U.S. PATENT DOCUMENTS

| | | | |
|---|---|---|---|
| 5,044,718 A | | 9/1991 | Kando |
| 5,081,630 A | * | 1/1992 | Lowenthal et al. ........... 372/20 |
| 5,181,214 A | * | 1/1993 | Berger et al. ................. 372/34 |
| 5,267,252 A | * | 11/1993 | Amano ......................... 372/34 |
| 5,442,651 A | * | 8/1995 | Maeda .......................... 372/97 |
| 5,446,750 A | * | 8/1995 | Ohtsuka et al. ............... 372/34 |
| 5,781,003 A | | 7/1998 | Kondo |
| 5,862,162 A | * | 1/1999 | Maeda .......................... 372/20 |
| 6,018,535 A | * | 1/2000 | Maeda .......................... 372/20 |
| 6,034,761 A | | 3/2000 | Takamiya |
| 6,526,071 B1 | * | 2/2003 | Zorabedian et al. .......... 372/20 |
| 6,665,321 B1 | * | 12/2003 | Sochava et al. .............. 372/20 |
| 6,700,904 B2 | * | 3/2004 | Asami .......................... 372/20 |
| 6,724,790 B1 | * | 4/2004 | Daiber et al. ................. 372/20 |
| 6,845,121 B2 | * | 1/2005 | McDonald .................... 372/34 |
| 2001/0036206 A1 | | 11/2001 | Jerman et al. |
| 2004/0101016 A1 | | 5/2004 | McDonald et al. |
| 2005/0135439 A1 | | 6/2005 | Chapman et al. |

OTHER PUBLICATIONS

Timothy Day, Frank Luecke, Michael Brownell, *Continuously Tunable Diode Lasers*, New Focus, Inc., Mountain View,California, Lasers & Optonics, Jun. 1993, 6 pages.

F.J. Duarte, *Multiple-prism granting designs tune diode lasers*, Laser Focus World, Feb. 1993, pp. 103-109.

M. de Lebachelerie, G. Passedat, *Mode-hop suppression of Littrow granting-tuned lasers*, Applied Optics vol. 32, No. 3, Jan. 20, 1993, pp. 269-274.

Michael G. Littman, *Single-Mode Operation of Grazing-Incidence Pulsed Dye Laser*, Optical Society of America, Optics Letters, vol. 3, No. 4, Oct. 1978, pp. 138-140.

(Continued)

*Primary Examiner*—Minsun Oh Harvey
*Assistant Examiner*—Tuan N. Nguyen
(74) *Attorney, Agent, or Firm*—Hanley, Flight & Zimmerman, LLC (57) ABSTRACT

External cavity optical transmitters are disclosed which include a gain chip and a mirror that define an optical cavity. The transmitters further include a modulator operated at or near the same temperature as the gain chip. In some examples, the optical transmitters are temperature controlled to optimize the efficiency and wavelength stability thereof, while maintaining acceptable chirp performance of the modulator. In some examples, the optical transmitters include an electro-optic module disposed within the optical cavity to change the path length thereof so that the efficiency and wavelength stability of the transmitter is optimized.

6 Claims, 5 Drawing Sheets

OTHER PUBLICATIONS

*82 nm of Continuous Tunability for an External Cavity Semiconductor Laser*, Electronics Letters, vol. 27, No. 2, Jan. 17, 1991, pp. 183-184.

Dr. Timothy Day, *External Cavity Tunable Lasers for Network Deploymen*, New Focus, Inc., San Jose, California, IEEE 2001 0-7803-7100-3/01, Mar. 2001, pp. 39-40.

Haim Lotem, *Littrow-Mounted Diffraction Granting Cavity*, Applied Optics, vol. 33, No. 6, Feb. 20, 1994, pp. 930-934.

Paul Zorabedian, *Characteristics of a Granting-External-Cavity Semiconductor Laser Containing Intracavity Prism Beam Expanders*, Jurnal of Lightware Technology, vol. 10, No. 3, Mar. 1992, pp. 330-335.

W.R. Trutna, L.F. Strokes, *Continuously Tuned External Cavity Semiconductor Laser*, Jurnal of Lightware Technology, vol. 11, No. 8, Aug. 1993, pp. 1279-1286.

\* cited by examiner

OPTICAL TRANSMITTERS

TECHNICAL FIELD

The present disclosure pertains to optical systems and, more particularly, to optical transmitters.

BACKGROUND

Optical systems are widely used in communications applications to facilitate the exchange of information such as voice and data over fiber cable, which may be fabricated from glass or any other suitable composite material. Both telephony and Internet-based systems exploit the wide bandwidth and large data capacity that optical systems provide. Additionally, as compared to conventional wired systems, optical networks are easily maintained and repaired.

Conventional optical systems include a transmitter having a distributed feedback (DFB) laser that operates at a wavelength at or near one of the wavelengths specified by the International Telecommunications Union (ITU). The DFB laser operates at an ITU specified wavelength within a particular temperature range. Outside the operating temperature range of the DFB laser, the DFB laser becomes detuned and no longer lases at the appropriate wavelength.

The optical transmitter also includes a modulator, such as an electro-absorption (EA) modulator that imparts information onto the emitted optical energy before the optical energy is coupled to the fiber optic cable. Like the DFB laser, the EA modulator has an optimal operating temperature range and wavelength at which the chirp, which represents the maximum distance that information may be transmitted from the EA modulator, was optimized.

For acceptable operation of the previously-described optical transmitter, the operating temperature of the EA modulator and the DFB laser must be matched. Failure to match the operating temperatures of these components leads either to a transmitter that lases at the proper frequency and has poor chirp performance or to a transmitter that has acceptable chirp performance, but lases at an incorrect wavelength or that drifts between wavelengths. As will be readily appreciated by those having ordinary skill in the art, the production yield of optical transmitters is very low when having to match the operating temperature ranges of two different components.

DETAILED DESCRIPTION OF THE PREFERRED EXAMPLES

Although the following discloses example systems including, among other components, software executed on hardware, it should be noted that such systems are merely illustrative and should not be considered as limiting. For example, it is contemplated that any or all of these hardware and software components could be embodied exclusively in dedicated hardware, exclusively in software, exclusively in firmware or in some combination of hardware, firmware and/or software. Accordingly, while the following describes example systems, persons of ordinary skill in the art will readily appreciate that the examples are not the only way to implement such systems.

Figure 1:
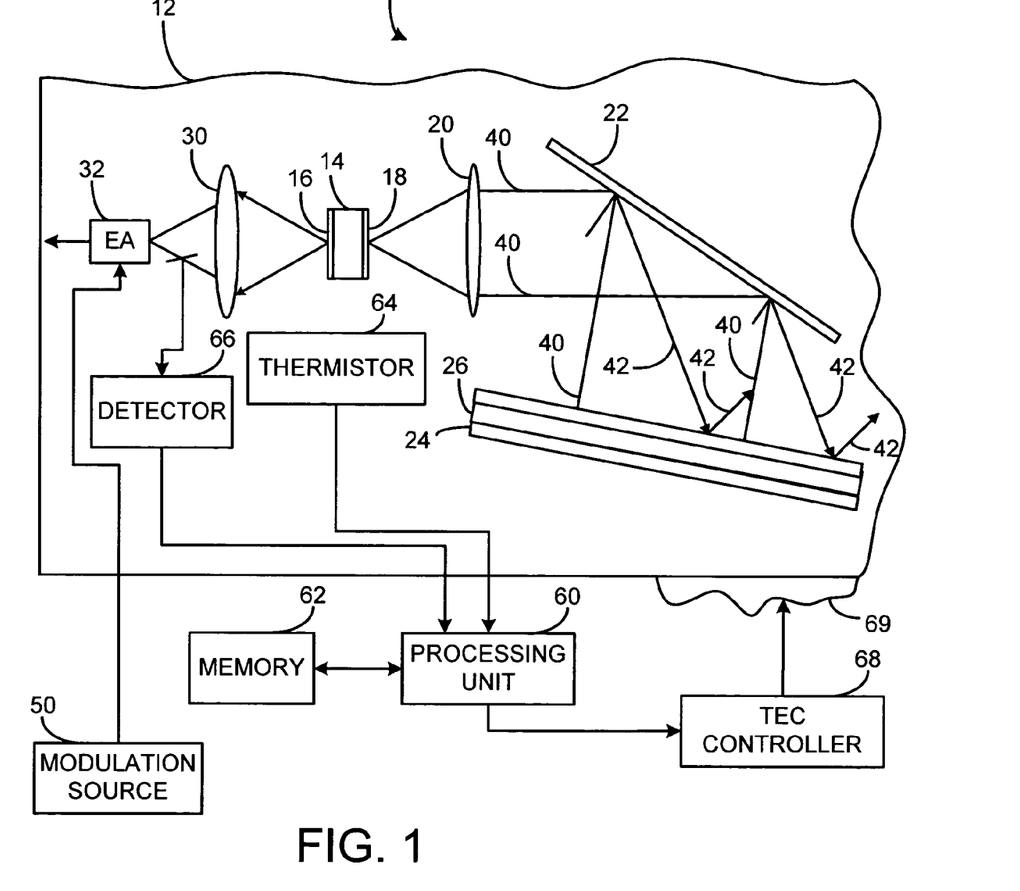
FIG. 1 is a diagram of an example optical transmitter.

Turning now to FIG. 1, an external cavity optical transmitter (optical transmitter) 10 includes a substrate 12 on which a number of components are disposed to form an external cavity laser. In particular, a gain chip 14 having first and second reflective coatings 16, 18, a first lens 20, a grating 22 and a mirror 24, which may be combined with an etalon 26, form a resonant optical cavity. The grating 22, mirror 24, etalon 26 and the first lens 20 are mounted in a manner that leaves them relatively thermally insensitive so that the temperature of the gain chip 14 may be varied without affecting the other components. The optical transmitter 10 further includes a second lens 30 disposed between the first reflective coating 16 of gain chip 14 and an electro-absorption chip (EA) 32.

Generally, during operation, when power is applied to the gain chip 14, the gain chip 14 emits optical energy through the second reflective coating 18 and the first lens 20 transfers the emitted optical energy to the grating 22. The grating 22 separates the optical energy into its constituent wavelengths and reflects a wavelength of interest to the mirror 24. This is represented in FIG. 1 by the ray lines 40. The optical energy emitted from the gain chip 14 at the wavelength of interest 40 reaches the mirror 24 and is reflected back from the mirror 24 to the grating 22 and through the first lens 20 to the gain chip 14. Accordingly, the gain chip 14 and the mirror 24 form an optical resonant cavity in which lasing at the wavelength of interest occurs. Optical energy that is not at the wavelength of interest reflects from the grating 22 to the mirror 24 at an angle such that the mirror 24 will not reflect that optical energy back to the gain chip 14, but instead reflects the undesired optical energy in a different direction. The reflection of wavelengths that are not of interest is represented in FIG. 1 by the ray lines 42. The etalon 26 is an additional filter that determines the wavelength selected for lasing. The combined response of the gain chip 14, the etalon 26 and the grating 22 determines the wavelength for lasing.

While the gain chip 14, the grating 22 and the mirror 24 form the optical resonant cavity, the gain chip 14, the second lens 30 and the EA 32 form the output of the optical transmitter 10. In particular, during operation, optical energy from the gain chip 14, which is a result of the lasing between the second reflective coating 18 and the mirror 24, is emitted from the gain chip 14 through the first reflective coating 16 and coupled to the EA 32 via the second lens 30. As shown in FIG. 1, the optical transmitter 10 may include a modulation source 50. The source 50 may be separate from or a part of the substrate 12, and provides an information signal to the EA 32 that causes the EA 32 to modulate the intensity of the optical energy passed therethrough. For example, the modulation source 50 may operate using pulse width modulation (PWM), on/off keying (OOK) or any other suitable modulation scheme. As will be readily appreciated by those having ordinary skill in the art, the EA 32 is a device having optical absorption characteristics that vary with the voltage applied to the EA 32. Accordingly, optical energy emitted from the gain chip 14 through the first reflective coating 16, which has a relatively constant intensity, may be intensity-modulated by the EA 32 in accordance with the signal applied thereto by the modulation source 50.

Having described the optical components of the optical transmitter 10, attention is now turned to the electrical components of the optical transmitter 10. As shown in FIG. 1, the optical transmitter 10 includes a processing unit 60 having an associated memory 62. A thermistor 64, a detector 66 and a thermoelectric cooler (TEC) controller 68 are each coupled to the processing unit 60. The TEC controller 68 is further coupled to the TEC 69, only a portion of which is shown as protruding from under the substrate 12. As will be readily appreciated, the TEC 69 may underlie a significant portion of the substrate 12 and, in conjunction with the TEC controller 68, maintains the substrate 12 at a desired temperature.

It should be noted that while the processing unit 60 and the memory 62 are shown as being separate and distinct components in FIG. 1, those having ordinary skill in the art will readily recognize that such a representation is merely one example configuration of a processing unit and its associated memory. For example, the processing unit 60 and the memory 64 could be integrated into one single processing unit including on-board memory.

Generally, the processing unit 60 receives a signal from the thermistor 64 indicative of the temperature of the substrate 12 and receives from the detector 66 a signal representative of the optical power output by the gain chip 14 during lasing. The processing unit 60 then generates an output signal that is coupled to the TEC controller 68, which controls the TEC 69 to set the temperature of the substrate 12 and the components disposed thereon.

Because the gain chip 14 and the EA 32 are disposed on the same substrate 12, the TEC 69 can maintain these components at the same, or nearly the same, temperatures. The TEC 69 may have a temperature control resolution of 0.1° C. In fact, the temperature range within which the substrate 12 is maintained is the temperature range within which the EA 32 has optimal or nearly optimal chirp performance, which, as noted previously, represents the ability of the EA 32 to transmit optical information great distances throughout an optical network.

The gain chip 14 emits optical energy within a range of wavelengths, wherein one particular wavelength is the dominant wavelength emitted by the gain chip 14. The combined response of the grating 22 and the etalon 26 further filters the output of the gain chip 14 and selects the desired wavelength for lasing. However, the optical length of the cavity formed by the gain chip 14 and the mirror 24 dictates the optical wavelength emitted from the gain chip 14 that will be selected for lasing. The temperature at which the gain chip 14 is maintained affects the optical length of the cavity and hence controls the lasing mode that will be the dominant wavelength. The highest efficiency of the optical transmitter 10 is realized when the dominant wavelength selected by the external cavity optics is aligned with the external cavity mode. Additionally, when the dominant wavelength of this external cavity laser is aligned with the external cavity mode, mode hopping of the external cavity laser is eliminated (i.e., the external cavity laser has mode hop free operation). Accordingly, as described below in detail in conjunction with FIGS. 2 and 3, the temperature of the substrate 12 may be varied within a range compatible with optimal EA 32 chirp performance to enable the gain chip 14 to operate at its maximum possible efficiency and mode hop free for the desired lasing wavelength.

As is well known to those having ordinary skill in the art, mode hopping is a situation in which multiple cavity modes (determined by the length of the external laser cavity) are capable of lasing in a laser and the laser hops between lasing at each mode and hence exhibits large wavelength instability. A laser operating in a mode hop free state has better wavelength stability and efficiency than the same laser operating in a mode hopping state.

The efficiency of the optical transmitter 10 and, in particular, the efficiency of the gain chip 14 is measured by comparing the operating current provided to the gain chip 14 by a current source (not shown) to the optical power output from the gain chip 14, as measured by the detector 66. Because, as described in conjunction with FIG. 2, the processing unit 60 implements a power control loop that maintains mode hop free operation and constant optical power as measured, for example, at the detector 66, the efficiency of the gain chip 14 may be determined merely by measuring operating current supplied to the gain chip 14. By monitoring the operating current required by the gain chip 14 as a function of the temperature range in which the substrate 12 operates to maintain acceptable performance of the EA 32, the processing unit 60 determines the temperature at which the substrate 12 should be maintained for optimal chirp and efficiency performance of the optical transmitter 10.

Figure 2:
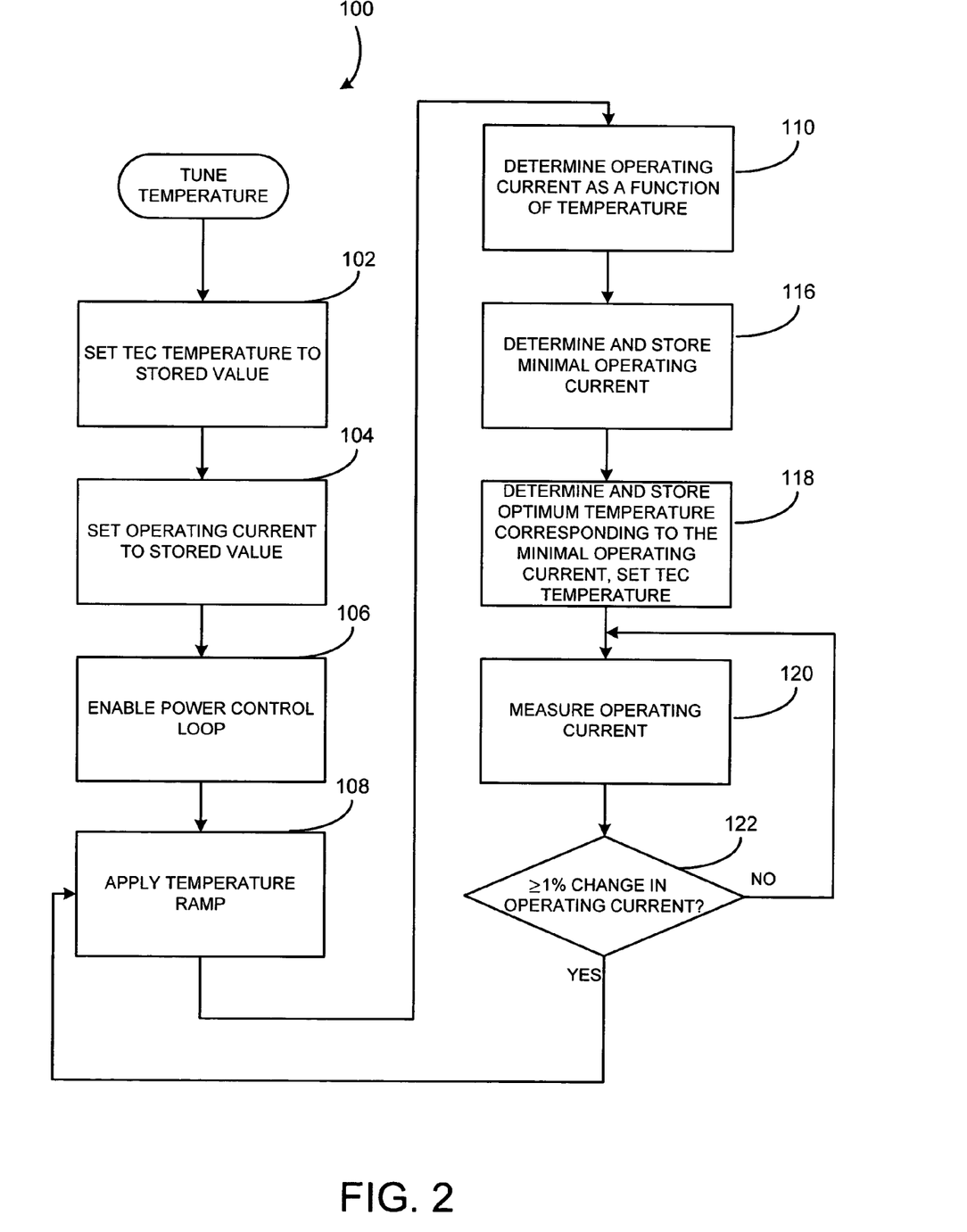
FIG. 2 is a flow diagram representing an example routine executed by the processing unit of FIG. 1.

Turning now to FIG. 2, a tune temperature routine 100 for mode hop elimination and operating efficiency executed by the processing unit 60 in conjunction with the memory 62 is described. The following describes the operation of the processing unit 60 in connection with FIG. 3. Where appropriate, for ease of understanding, the following description refers to the various components and portions of FIGS. 1 and 3 as the operation of the processing unit 60 is described.

When the processing unit 62 begins execution of the routine 100, the temperature of the substrate 12 is set to a stored value (block 102) via the TEC controller 68 and the TEC 69. In this example, the stored temperature is a temperature at which the EA 32 has optimal chirp performance. After the temperatures of the TEC 69 and the substrate 12 are set to the stored value, an operating current supplied to the gain chip 14 is set to a stored value (block 104). The stored value of the operating current is a starting point at which the processing unit 60 enables a power control loop that controls gain chip operating current to maintain a constant desired output (block 106). The power control loop operates to increase or decrease the operating current supplied at the gain chip 14 to maintain the power output from the gain chip 14 at a constant or relatively constant value.

To this point, the processing unit 60 executing the routine 100 has caused the gain chip 14 to operate at a steady state that is mode hop free and at which the output power is constant or nearly constant and the temperature of the substrate 12 is controlled to be a prestored value. The following describes how the processing unit 60 executes the routine 100 to find an optimal substrate temperature at which the operating current supplied to the gain chip 14 is minimal or near minimal for the desired output power from the gain chip 14 in a mode hop free operating state. Accordingly, after the power control loop is enabled (block 106), the processing unit 60 commands the TEC controller 68 to apply a temperature ramp to the substrate 12 (block 108). In this example, the temperature ramp ranges from a temperature that is approximately one-half of one degree Centigrade below the stored temperature value to approximately one-half of one degree Centigrade above the stored temperature value. Alternatively, any other suitable temperature range may be selected, bearing in mind that a 5–8° C. temperature variation at the gain chip 14 may be sufficient to vary the phase of the optical energy emitted from the gain chip by as much as π radians, at which the gain chip 14 may begin mode hopping and begin lasing at another wavelength. However, it is desirable for the temperature range to include temperatures over which the performance of the EA 32 maintains acceptable chirp characteristics.

Figure 3:
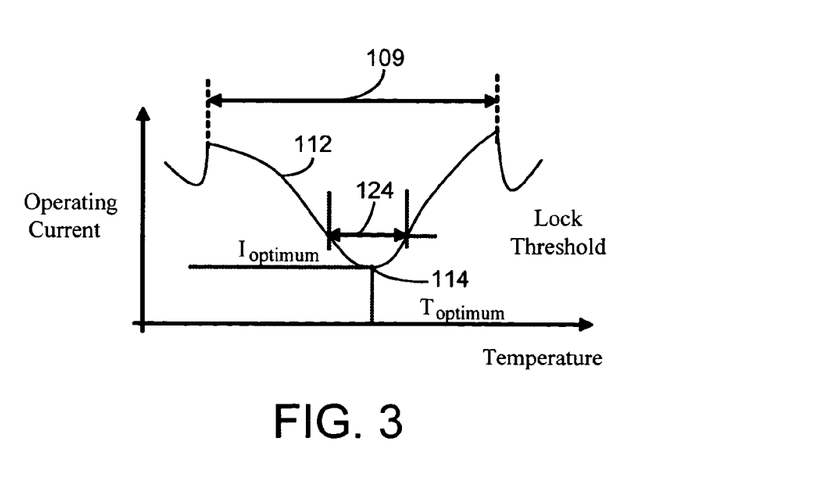
FIG. 3 is a diagram representing an example operating current versus temperature response of the optical transmitter of FIG. 1.

As the processing unit 60 and the TEC controller 68 apply the temperature ramp to the substrate 12, the processing unit 60 monitors (as a function of substrate temperature) the operating current supplied to the gain chip 14 (block 110). For example, as shown in FIG. 3, operating current may be plotted as a function of temperature as shown at reference numeral 112. As will be readily appreciated by those having ordinary skill in the art upon examining FIG. 3, a plot 112 of operating current as a function of temperature includes a local minimum specified at reference numeral 114. It is at the local minimum 114 that the efficiency of the optical transmitter 10 is optimum because the constant power out of the gain chip 14 requires the minimal operating current at the optimum temperature. Additionally, at the local minimum 114, the optical transmitter 10 operates in a mode hop free manner. An operating temperature either lower or higher than the optimum temperature, which is the temperature at the minimum 114, requires a higher operating current than the optimum current, which is also denoted at the minimum 114, and the likelihood that the optical transmitter 10 will mode hop increases. Therefore, the gain chip 14 is stable and operating in the most efficient manner at the temperature labeled by reference numeral 114.

As shown in FIG. 3, a lock threshold 124 illustrates a temperature range in which there is less than one percent change between the operating current and the optimum operating current, which is represented by the minimum point 114. The lock threshold 124 illustrates the operating point at which efficiency of the optical transmitter is good and there is little chance of a mode hopping occurrence. The application of the temperature ramp (block 108) is shown at reference numeral 109, which illustrates a temperature range across which the temperature ramp spans.

After the processing unit 60 determines operating current as a function of temperature (block 110), the processing unit 60 determines and stores the minimum operating current (block 116) and determines and stores an optimum temperature of the substrate 12 corresponding to the minimal operating current (block 118). The processing unit 60 finds the minimum of the plot 112 by twice differentiating the plot 112 with respect to temperature to determine slope change of the plot, also referred to as concavity. The processing unit 60 then examines the results of the first and second differentiation to find a point on the plot 112 having a zero slope change and a negative slope before and a positive slope thereafter. The point on the plot 112 having zero slope that is bounded by negative and positive slopes is referred to as the optimum operating point at which an optimum or minimum operating current corresponds to an optimum substrate 12 temperature.

At this point, the processing unit 60 and the TEC controller 68 cooperate to keep the temperature of the substrate 12 at approximately the optimum temperature that corresponds to the optimum operating current, thereby causing the optical transmitter 10 to operate at its most efficient operating point. Although the optical transmitter 10 should continue to operate at the minimal operating current as long as the substrate 12 is maintained at the optimum temperature corresponding thereto, the processing unit 60 continues to monitor the operating current supplied to the gain chip 14 (block 120). A one-percent or greater change in operating current (detected at block 122) will cause the processing unit 60 to apply a temperature ramp to the substrate 12 (block 108) and to again seek and store the optimum operating current and the optimum temperature corresponding thereto. The one-percent change may be due to aging of the gain chip, movement of optical components due to aging or the like. However, as long as the processing unit 60 determines that there is less than a one-percent change in operating current (again, detected at block 122) the processing unit 60 continues to measure operating current 120 (block 120).

After the optical transmitter 10 is powered-up and the processing unit 60 has executed information or instructions corresponding to blocks 102–106 of FIG. 2, the processing unit 60 continues to operate between blocks 108 and 122 of FIG. 2. If the optical transmitter 10 were powered down, the stored TEC temperature and stored operating current recalled at blocks 102 and 104 would typically be the stored operating current and optimum temperature stored at blocks 116 and 118, which were stored before the optical transmitter 10 was powered down.

Figure 4:
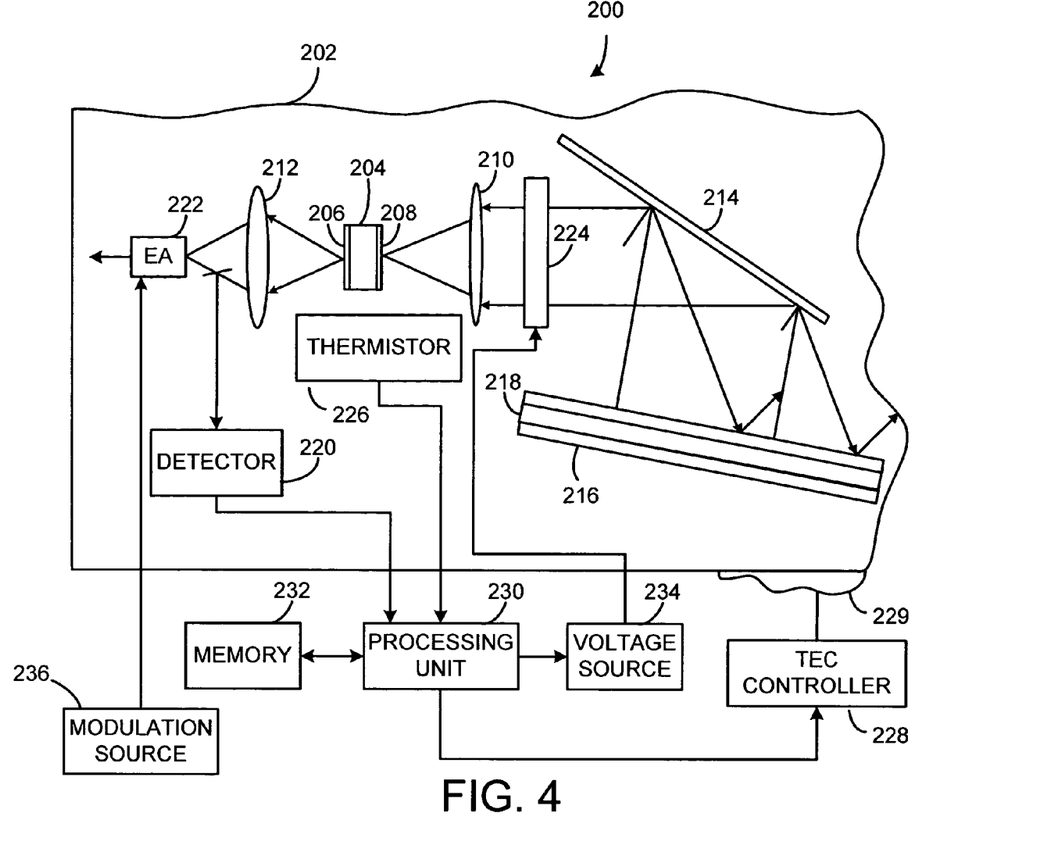
FIG. 4 is a diagram of a second example optical transmitter.

Turning now to FIG. 4, another example external cavity optical transmitter (optical transmitter) 200 is shown. The optical transmitter 200 includes a substrate 202, a gain chip 204 having first and second reflective coatings 206, 208, first and second lenses 210, 212, a grating 214, a mirror 216, an etalon 218, a detector 220 and an EA 222. Each of the components disposed on the substrate 202 may be similar or identical to the components described in conjunction with FIG. 1. However, the optical transmitter 200 further includes an electro-optic crystal (EO) 224 disposed between the first lens 210 and the grating 214. In operation, as the bias voltage on the EO 224 is changed, the refractive index though the EO 224 changes, thereby changing the effective optical path length between the gain chip 204 and the mirror 216, which, in turn, changes the wavelength at which the gain chip 204 lases, thereby controlling the wavelength and efficiency of the optical transmitter 200 and minimizing the likelihood of mode hopping operation.

In terms of electrical components associated with the optical transmitter 200, many are the same as those described in conjunction with the optical transmitter 10 of FIG. 1. These devices include a detector 220, a thermistor 226 and a TEC controller 228, which is coupled to a TEC 229. The optical transmitter 200 further includes a processing unit 230 and an associated memory 232. The processing unit 230 is coupled to the detector 220, the thermistor 226, the TEC controller 228 and is further coupled to a voltage source 232. The voltage source 232 is coupled to the EO 224.

Generally, during operation, the processing unit 230 controls the voltage source 232 to change the voltage bias applied to the EO 224 to alter the refractive index thereof. Accordingly, the effective optical path length, between the gain chip 204 and the mirror 216 changes with the bias voltage applied to the EO 224. While the example optical transmitter 10 of FIG. 1 varied temperature of the substrate 12 to control the wavelength at which the gain chip 14 lased, the example optical transmitter 200 of FIG. 4 controls the refractive index of the EO 224 (and, therefore, the effective optical path length between the gain chip 204 and the mirror 216) to affect the wavelength at which the gain chip 204 lases. Further detail on the operational aspects of the optical transmitter 200 are now provided in conjunction with FIGS. 5 and 6.

Figure 5:
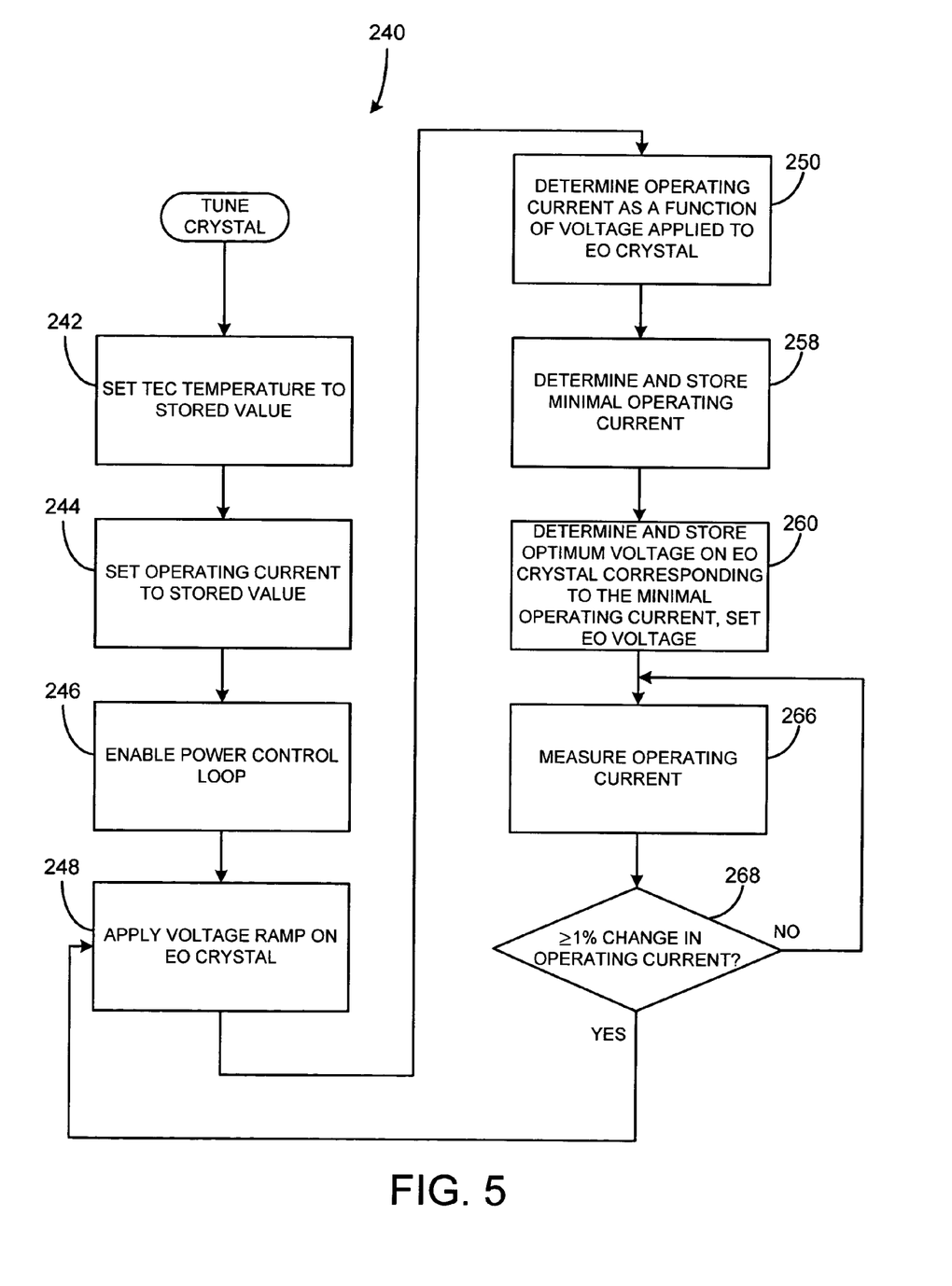
FIG. 5 is a flow diagram representing an example routine executed by the processing unit of FIG. 4.

Turning now to FIG. 5, a tune crystal routine 240 executed by the processing unit 230 is represented in block diagram format. Upon power-up, the processing unit 230 sets the substrate 202, via the TEC 229, to a stored temperature value (block 242), which is a value at which the EA 222 has optimal or nearly optimal chirp performance. After the TEC temperature is set, the operating current associated with the gain chip 204 is set to a stored value (block 244) and a power control loop is enabled (block 246). Like the power control loop described in conjunction with FIG. 2, the power control loop of FIG. 5 keeps the optical power output of the gain chip 204 at a constant value and changes the operating current supplied to the gain chip 204 to achieve this goal.

After the power control loop is enabled (block 246), the processing unit 230 and the voltage source 232 cooperate to apply a voltage ramp to the EO 224 (block 248). The voltage ramp varies the refractive index of the EO 224, thereby adjusting the path length within the optical cavity defined between the gain chip 204 and the mirror 216. In this example, the voltage ramp on the EO 224 varies the path length through a range of one-half wavelength. For example, the voltage applied to the EO 224 may vary between +/−10 volts (V) and +/−100 V.

Figure 6:
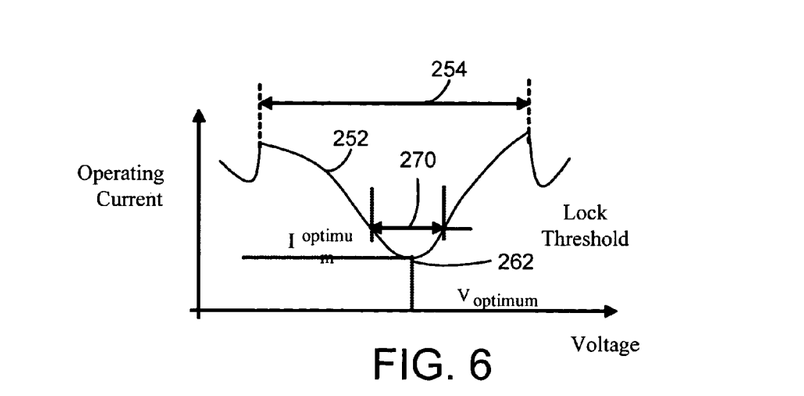
FIG. 6 is a diagram representing an example operating current versus voltage response of the optical transmitter of FIG. 4.

As the voltage ramp is applied to the EO 224, the processing unit 230 measures operating current supplied to the gain chip 204 as a function of the voltage applied to the EO 224 (block 250). For example, as shown in FIG. 6, a plot 252 shows operating current versus voltage on the EO 224. The line 254 represents an example voltage range that may be applied to the EO 224 to generate the plot 252.

After the processing unit 230 determines operating current as a function of the EO voltage, a minimal operating current is determined and stored (block 258) and an optimum voltage on the EO 224 corresponding to the minimal operating current is determined (block 260). As shown in FIG. 6, a point on the plot 252 representing the minimal operating current is designated with reference numeral 262. At the point 262, the operating current is at a minimum and, therefore, the gain chip 204 is operating at its optimal efficiency given the fixed output power constraint enforced by the power control loop. In this example, the minimum operating current is determined by taking one or more derivatives of the plot 252 with respect to EO voltage. The minimum point 262 is a point having a second derivative value of zero that is bounded by plot portions having negative and positive first derivatives. The processing unit 230 then commands the voltage source 232 to apply to the EO 224 the voltage corresponding to the minimal operating current.

Once the minimal operating current, which is also the operating point at which the optical transmitter 200 will have mode hop free operation, has been determined, stored and applied (block 260) the operating current provided to the gain chip 204 is measured (block 266). The measured operating current is monitored for a one-percent or greater change therein. If a one-percent or greater change in the operating current exists (block 268), the voltage on the EO 224 is ramped and processing unit 230 repeats the process of determining the minimal operating current (blocks 248–260). Alternatively, if there is less than a one-percent change in the operating current, the processing unit 230 continues to monitor the operating current until such a change occurs. Again, as described in conjunction with FIG. 3, the lock threshold range of less than one-percent change in operating current guarantees mode hop free operation of the external cavity laser. The line 270, shown in FIG. 6, represents the voltage range corresponding to a less than one-percent change in operating current.

Figure 7:
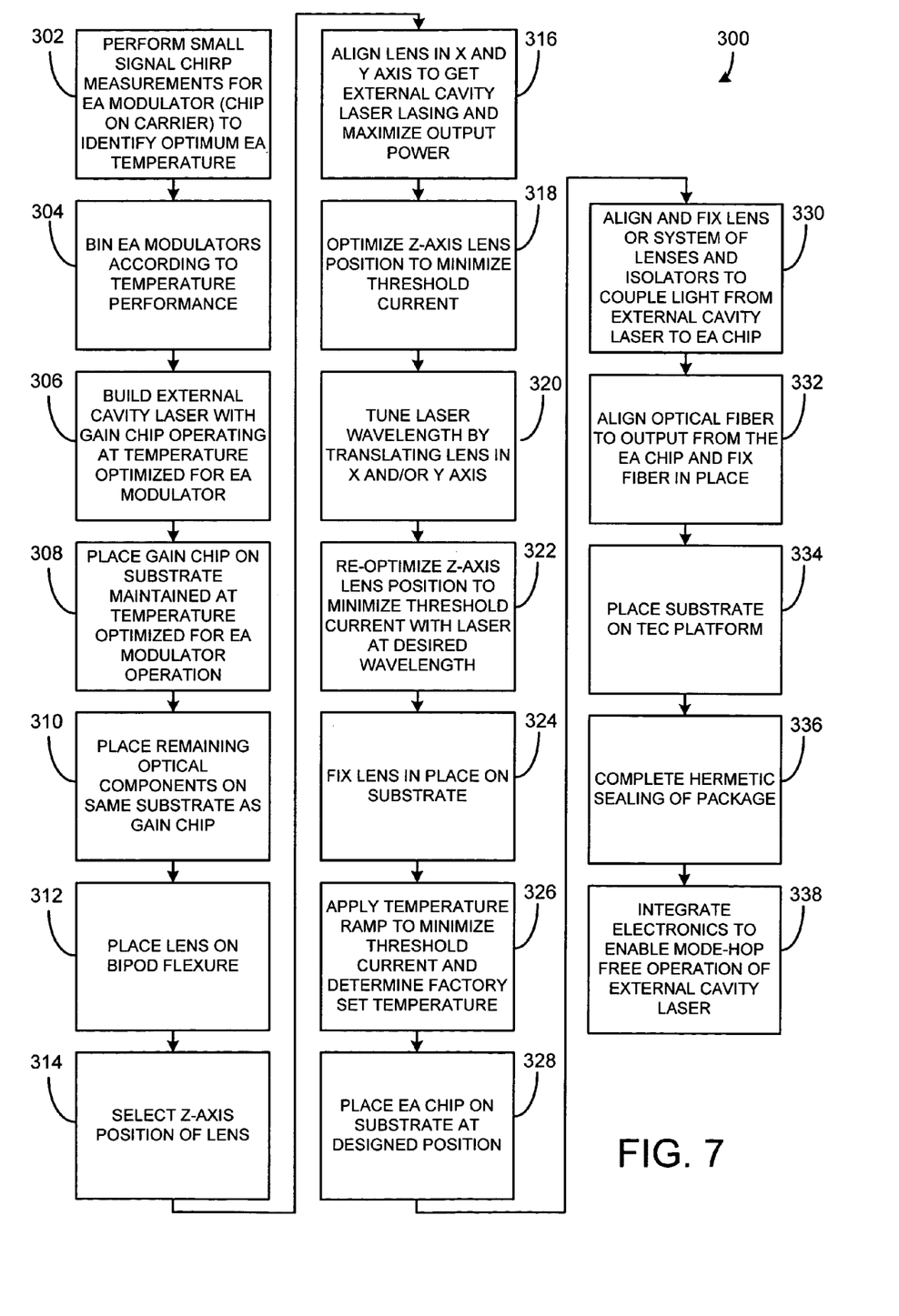
FIG. 7 is a diagram of an example process by which the optical transmitters of FIGS. 1 and 4 may be manufactured.

Turning now to FIG. 7, an example process by which the optical transmitters 10, 200 may be fabricated is shown at reference numeral 300. The process begins by performing small signal chirp measurements on each EA to be used in the manufacturing process to identify an optimum operational temperature and wavelength for which EA chirp is best (block 302). The EAs are then sorted according to their optimal performance temperatures/wavelengths (block 304). An external cavity laser is then fabricated with a gain chip that operates at the wavelength and temperature optimized for one of the EAs (block 306) and the gain chip is placed on a substrate that will be maintained at a temperature optimized for the selected EA chirp performance (block 308). The remaining optical components of the transmitters 10, 200 are then placed on the substrate with the gain chip (block 310).

After the optical components have been placed on the substrate, the first lens is placed on a bipod flexure and is located between the gain chip and the grating in a position in which the x, y, and z-axes position of the first lens cause the external cavity laser to begin lasing (blocks 312–316). After the lens is located in the x, y, and z-axes, the z-axis location of the first lens is optimized to minimize the threshold current required for lasing (block 318) and the wavelength of the laser is tuned by translating the first lens in the x and/or y-axis directions (block 320). After the laser wavelength has been tuned, the z-axis position of the first lens is reoptimized to minimize the threshold current at the desired wavelength of lasing (block 322) and the first lens is fixed in place on the substrate (block 324).

After the first lens has been fixed in place, a temperature ramp is applied to the substrate and the threshold current supplied to the gain chip is monitored during the temperature ramp to determine the optimal temperature for the gain chip operation (block 326). At this point, the EA is placed on the substrate at a designed position in relation to the second lens and any other suitable components shown in FIGS. 1 and 4 are aligned and fixed to couple optical energy from the gain chip to the EA (blocks 328–330). An optical fiber is then aligned from the output of the EA to couple optical energy therefrom (block 332). The substrate is then placed on the TEC platform so that the temperature of the substrate can be controlled (block 334) and the hermetic sealing of the optical transmitter 10, 200 is then completed (block 336). Finally, the electronics associated with the optical systems (e.g., the processing unit, memory, the TEC controller and the thermistor) are coupled to the external cavity optical transmitter to ensure mode hop free operation of the laser (block 338).

Although certain methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A method of operating an external cavity optical transmitter including a gain chip and an optical modulator coupled to a temperature controlled substrate having an associated temperature, the method comprising:
maintaining the temperature controlled substrate, the gain chip and the optical modulator between a first temperature and a second temperature between which the optical modulator has an acceptable performance characteristic;

varying the temperature of the temperature controlled substrate, the gain chip and the optical modulator from the first temperature to the second temperature;

measuring an operating current supplied to the gain chip as the temperature of the temperature controlled substrate, the gain chip and the optical modulator varies from the first temperature to the second temperature;

determining an optimum temperature between the first temperature and the second temperature that corresponds to a minimum operating current; and maintaining the temperature of the temperature controlled substrate, the gain chip and the optical modulator at the optimum temperature.

2. The method as defined in claim 1, wherein a temperature difference between the first temperature and the second temperature comprises about two degrees Centigrade.

3. The method as defined in claim 1, wherein determining an optimum temperature comprises determining operating current as a function of temperature.

4. The method as defined in claim 3, wherein determining an optimum temperature comprises taking a derivative of the operating current as a function of temperature.

5. The method as defined in claim 3, wherein determining an optimum temperature comprises taking first and second derivatives of the operating current as a function of temperature.

6. The method as defined in claim 1, further comprising:

measuring the operating current and comparing it to the minimum operating current; and if a difference between the operating current and the minimum operating current exceeds a predetermined threshold, (a) varying the temperature of the temperature controlled substrate, the gain chip and the optical modulator from the first temperature to the second temperature, (b) measuring the operating current supplied to the gain chip as the temperature of the temperature controlled substrate, the gain chip and the optical modulator varies from the first temperature to the second temperature, (c) determining a second optimum temperature between the first temperature and the second temperature that corresponds to a second minimum operating current, and (d) maintaining the temperature of the temperature controlled substrate, the gain chip and the optical modulator at the second optimum temperature.

* * * * *